United States Patent
Kumar et al.

(10) Patent No.: US 10,578,670 B2
(45) Date of Patent: *Mar. 3, 2020

(54) CORE TESTING MACHINE

(71) Applicant: Contec, LLC, Schenectady, NY (US)

(72) Inventors: Samant Kumar, San Jose, CA (US); Dinesh Kumar, Patna Bihar (IN); Shivashankar Diddimani, Karnataka (IN); Gunjan Samaiya, Madhya Pradesh (IN)

(73) Assignee: Contec, LLC, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/722,235

(22) Filed: Oct. 2, 2017

(65) Prior Publication Data

US 2018/0024193 A1      Jan. 25, 2018

Related U.S. Application Data

(63) Continuation of application No. 14/866,720, filed on Sep. 25, 2015, now Pat. No. 9,810,735.

(51) Int. Cl.
| | | |
|---|---|---|
| G06F 11/27 | (2006.01) | |
| G01R 31/317 | (2006.01) | |
| G01R 31/3177 | (2006.01) | |
| G06F 11/273 | (2006.01) | |

(52) U.S. Cl.
CPC ... *G01R 31/31715* (2013.01); *G01R 31/3177* (2013.01); *G06F 11/273* (2013.01)

(58) Field of Classification Search
CPC .............................. G06F 11/273; G06F 11/27
USPC ........................................................ 714/27
See application file for complete search history.

(56) References Cited

U.S. PATENT DOCUMENTS

| | | |
|---|---|---|
| 5,005,197 A | 4/1991 | Parsons et al. |
| 5,897,609 A | 4/1999 | Choi et al. |
| 5,910,977 A | 6/1999 | Torregrossa |
| 5,917,808 A | 6/1999 | Koshbab |
| 6,088,582 A | 7/2000 | Canora et al. |
| 6,308,496 B1 | 10/2001 | Lee |
| 6,367,032 B1 * | 4/2002 | Kasahara ............ G06F 11/2236 714/25 |
| 6,662,135 B1 | 12/2003 | Burns |

(Continued)

FOREIGN PATENT DOCUMENTS

| | | |
|---|---|---|
| CN | 202261360 | 5/2012 |
| WO | 2001013604 | 2/2001 |

(Continued)

OTHER PUBLICATIONS

Kumar, Samant; Advisory Action for U.S. Appl. No. 15/642,915, filed Jul. 6, 2017, dated Jul. 23, 2018, 18 pgs.

(Continued)

*Primary Examiner* — Kamini B Patel
(74) *Attorney, Agent, or Firm* — Taylor English Duma LLP

(57) ABSTRACT

A testing system includes a slot configured to receive a device-under-test (DUT), and a core testing processor configured to communicate with a user interface and with the slot, wherein the core testing processor is associated with communication that is independent of any other communications transmitted within the system, and wherein the core testing processor executes a set of tests associated with the DUT.

8 Claims, 2 Drawing Sheets

(56) References Cited

U.S. PATENT DOCUMENTS

| | | |
|---|---|---|
| 6,671,160 B2 | 12/2003 | Hayden |
| 6,826,512 B2 | 11/2004 | Dara-Abrams et al. |
| 6,859,043 B2 | 2/2005 | Ewing |
| 7,068,757 B1 | 6/2006 | Burnett |
| 7,254,755 B2 | 8/2007 | De Obaldia et al. |
| 7,664,317 B1 | 2/2010 | Sowerby |
| 7,809,517 B1 | 10/2010 | Zuckerman |
| 8,121,028 B1 | 2/2012 | Schlesener |
| 8,209,732 B2 | 6/2012 | Le |
| 8,229,344 B1 | 7/2012 | Petersen |
| 8,324,909 B2 | 12/2012 | Oakes |
| 8,418,000 B1 | 4/2013 | Salame |
| 8,418,219 B1 | 4/2013 | Parsons |
| 8,515,015 B2 | 8/2013 | Maffre |
| 8,689,071 B2 | 4/2014 | Valakh |
| 8,806,400 B1 | 8/2014 | Bhawmik |
| 9,013,307 B2 | 4/2015 | Hussain |
| 9,270,983 B1 | 2/2016 | Hare, Jr. |
| 9,316,714 B2 | 4/2016 | Rada |
| 9,319,908 B2 | 4/2016 | Nickel |
| 9,372,228 B2 | 6/2016 | Nickel |
| 9,402,601 B1 | 8/2016 | Berger |
| 9,490,920 B2 | 11/2016 | Parte |
| 9,491,454 B1* | 11/2016 | Kumar .................. H04N 17/04 |
| 9,571,211 B2 | 2/2017 | Partee |
| 9,602,556 B1 | 3/2017 | Cham |
| 9,609,063 B2 | 3/2017 | Zhu et al. |
| 9,810,735 B2 | 11/2017 | Kumar et al. |
| 9,838,295 B2 | 12/2017 | Kumar et al. |
| 9,900,113 B2 | 2/2018 | Kumar et al. |
| 9,900,116 B2 | 2/2018 | Kumar et al. |
| 9,960,989 B2 | 5/2018 | Kumar et al. |
| 9,992,084 B2 | 6/2018 | Kumar et al. |
| 10,116,397 B2 | 10/2018 | Kumar et al. |
| 10,122,611 B2 | 11/2018 | Kumar et al. |
| 10,158,553 B2 | 12/2018 | Tiwari et al. |
| 10,230,617 B2 | 3/2019 | Kumar et al. |
| 10,277,497 B2 | 4/2019 | Tiwari et al. |
| 10,291,959 B2 | 5/2019 | Kumar et al. |
| 10,298,483 B2 | 5/2019 | Kumar et al. |
| 10,320,651 B2 | 6/2019 | Kumar et al. |
| 2002/0070725 A1 | 6/2002 | Hilliges |
| 2002/0077786 A1 | 6/2002 | Vogel et al. |
| 2003/0005380 A1 | 1/2003 | Nguyen |
| 2003/0184035 A1 | 10/2003 | Yu |
| 2004/0010584 A1* | 1/2004 | Peterson ............... H04L 41/046 709/224 |
| 2004/0016708 A1 | 1/2004 | Rafferty |
| 2004/0160226 A1 | 8/2004 | Ewing |
| 2004/0189281 A1 | 9/2004 | Le et al. |
| 2004/0203726 A1 | 10/2004 | Wei |
| 2005/0041642 A1 | 2/2005 | Robinson |
| 2005/0053008 A1 | 3/2005 | Griesing |
| 2005/0102488 A1* | 5/2005 | Bullis ..................... H04L 43/00 712/14 |
| 2005/0193294 A1 | 9/2005 | Hildebrant |
| 2005/0249196 A1 | 11/2005 | Ansari et al. |
| 2005/0286466 A1 | 12/2005 | Tagg |
| 2006/0015785 A1 | 1/2006 | Chun |
| 2006/0271322 A1 | 11/2006 | Haggerty |
| 2007/0097659 A1 | 5/2007 | Behrens |
| 2007/0220380 A1 | 9/2007 | Ohanyan |
| 2008/0026748 A1 | 1/2008 | Alexander et al. |
| 2008/0117907 A1 | 5/2008 | Hein |
| 2008/0144293 A1 | 6/2008 | Aksamit |
| 2008/0159737 A1 | 7/2008 | Noble et al. |
| 2008/0168520 A1 | 7/2008 | Vanderhoff |
| 2008/0274712 A1 | 11/2008 | Rofougaran |
| 2008/0315898 A1 | 12/2008 | Cannon |
| 2009/0059933 A1 | 3/2009 | Huang |
| 2009/0089854 A1 | 4/2009 | Le |
| 2009/0213738 A1 | 8/2009 | Volpe et al. |
| 2009/0254976 A1 | 10/2009 | Huotari et al. |
| 2009/0282446 A1 | 11/2009 | Breed |
| 2009/0282455 A1 | 11/2009 | Bell et al. |
| 2009/0289020 A1 | 11/2009 | Wurmhoringer |
| 2010/0132000 A1 | 5/2010 | Straub |
| 2010/0138823 A1* | 6/2010 | Thornley .................. G06F 8/61 717/174 |
| 2010/0246416 A1 | 9/2010 | Sinha |
| 2010/0281107 A1 | 11/2010 | Fallows et al. |
| 2011/0001833 A1 | 1/2011 | Grinkemeyer |
| 2011/0006794 A1 | 1/2011 | Sellathamby |
| 2011/0012632 A1 | 1/2011 | Merrow |
| 2011/0035676 A1 | 2/2011 | Tischer |
| 2011/0072306 A1* | 3/2011 | Racey .................. G06F 11/273 714/27 |
| 2011/0090075 A1 | 4/2011 | Armitage et al. |
| 2011/0099424 A1* | 4/2011 | Rivera Trevino ..... G06F 11/263 714/25 |
| 2011/0107074 A1 | 5/2011 | Chan et al. |
| 2011/0116419 A1 | 5/2011 | Cholas |
| 2011/0149720 A1 | 6/2011 | Phuah et al. |
| 2011/0222549 A1 | 9/2011 | Connelly |
| 2011/0267782 A1 | 11/2011 | Petrick |
| 2011/0306306 A1 | 12/2011 | Reed |
| 2012/0140081 A1 | 1/2012 | Clements |
| 2012/0122406 A1 | 5/2012 | Gregg et al. |
| 2012/0163227 A1 | 6/2012 | Kannan |
| 2012/0198084 A1* | 8/2012 | Keskitalo ................ H04L 67/02 709/228 |
| 2012/0198442 A1 | 8/2012 | Kashyap |
| 2012/0213259 A1 | 8/2012 | Renken et al. |
| 2012/0220240 A1 | 8/2012 | Rothschild |
| 2012/0275784 A1 | 11/2012 | Soto |
| 2012/0278826 A1 | 11/2012 | Jones |
| 2012/0306895 A1 | 12/2012 | Faulkner et al. |
| 2013/0014983 A1 | 1/2013 | Korson et al. |
| 2013/0033279 A1 | 2/2013 | Sozanski |
| 2013/0049794 A1 | 2/2013 | Humphrey |
| 2013/0076217 A1 | 3/2013 | Thompson |
| 2013/0093447 A1 | 4/2013 | Nickel |
| 2013/0104158 A1 | 4/2013 | Partee |
| 2013/0152047 A1 | 6/2013 | Moorthi et al. |
| 2013/0160064 A1 | 6/2013 | Van Rozen |
| 2013/0167123 A1* | 6/2013 | Dura .................. G06F 11/3624 717/127 |
| 2013/0257468 A1 | 10/2013 | Mlinarsky |
| 2013/0305091 A1* | 11/2013 | Stan ...................... G06F 11/263 714/35 |
| 2014/0047322 A1 | 2/2014 | Kim |
| 2014/0091874 A1 | 4/2014 | Cook et al. |
| 2014/0115580 A1 | 4/2014 | Kellerman |
| 2014/0123200 A1 | 5/2014 | Park |
| 2014/0126387 A1 | 5/2014 | Gintis |
| 2014/0156819 A1* | 6/2014 | Cavgalar ................ H04L 69/08 709/223 |
| 2014/0187172 A1 | 7/2014 | Partee |
| 2014/0187173 A1* | 7/2014 | Partee .................. H04L 43/045 455/67.12 |
| 2014/0207404 A1 | 7/2014 | Fritzsche |
| 2014/0256373 A1 | 9/2014 | Hernandez |
| 2014/0266930 A1 | 9/2014 | Huynh |
| 2014/0269386 A1 | 9/2014 | Chu |
| 2014/0269871 A1 | 9/2014 | Huynh |
| 2014/0282783 A1 | 9/2014 | Totten |
| 2014/0370821 A1 | 12/2014 | Guterman |
| 2015/0024720 A1 | 1/2015 | Efrati |
| 2015/0093987 A1 | 4/2015 | Ouyang |
| 2015/0109941 A1 | 4/2015 | Zhang |
| 2015/0151669 A1 | 6/2015 | Meisner |
| 2015/0180743 A1 | 6/2015 | Jana et al. |
| 2015/0226716 A1 | 8/2015 | Nelson |
| 2015/0237010 A1 | 8/2015 | Roskind |
| 2015/0253357 A1 | 9/2015 | Olgaard |
| 2015/0288589 A1 | 10/2015 | Radford et al. |
| 2015/0369851 A1 | 12/2015 | Even |
| 2016/0080241 A1 | 3/2016 | Rocha De Maria |
| 2016/0102951 A1 | 4/2016 | Cole |
| 2016/0191364 A1* | 6/2016 | Ajitomi .................. H04L 43/10 709/224 |
| 2016/0381818 A1 | 12/2016 | Mills |
| 2017/0048519 A1 | 2/2017 | Friel |

(56) References Cited

U.S. PATENT DOCUMENTS

| | | | |
|---|---|---|---|
| 2017/0089981 A1* | 3/2017 | Kumar | ............. G01R 31/31715 |
| 2017/0093682 A1 | 3/2017 | Kumar | |
| 2017/0093683 A1 | 3/2017 | Kumar | |
| 2017/0126536 A1 | 5/2017 | Kumar | |
| 2017/0126537 A1 | 5/2017 | Kumar | |
| 2017/0126539 A1 | 5/2017 | Tiwari | |
| 2017/0149635 A1* | 5/2017 | Kumar | .................... H04L 43/12 |
| 2017/0149645 A1 | 5/2017 | Kumar | |
| 2017/0195071 A1* | 7/2017 | Kumar | ............... H04B 17/0085 |
| 2017/0250762 A1 | 8/2017 | Kumar et al. | |
| 2017/0288791 A1 | 10/2017 | Kumar et al. | |
| 2017/0288993 A1 | 10/2017 | Kumar et al. | |
| 2017/0289012 A1 | 10/2017 | Tiwari et al. | |
| 2017/0302994 A1* | 10/2017 | Kumar | ................ H04L 41/0253 |
| 2018/0076908 A1 | 3/2018 | Kumar et al. | |
| 2018/0077046 A1 | 3/2018 | Kumar et al. | |
| 2018/0351846 A1 | 12/2018 | Kumar et al. | |
| 2019/0109778 A1 | 4/2019 | Kumar et al. | |
| 2019/0182134 A1 | 6/2019 | Kumar et al. | |
| 2019/0190625 A1 | 6/2019 | Kumar et al. | |
| 2019/0260664 A1 | 8/2019 | Kumar et al. | |
| 2019/0273675 A1 | 9/2019 | Kumar et al. | |

FOREIGN PATENT DOCUMENTS

| | | |
|---|---|---|
| WO | 2013169728 | 11/2013 |
| WO | 2014035462 | 3/2014 |
| WO | 2014065843 | 5/2014 |
| WO | 2017053961 | 3/2017 |
| WO | 2017074872 | 5/2017 |

OTHER PUBLICATIONS

Kumar, Samant; Corrected Notice of Allowability for U.S. Appl. No. 14/866,752, filed Sep. 25, 2015, dated Jul. 10, 2018, 5 pgs.

Kumar, Samant; Non-Final Office Action for U.S. Appl. No. 15/624,950, filed Jun. 16, 2017, dated Jul. 9, 2018, 50 pgs.

Kumar, Samant; Corrected Notice of Allowance for U.S. Appl. No. 15/624,961, filed Jun. 16, 2017, dated Jun. 28, 2018, 7 pgs.

Kumar, Samant; Advisory Action for U.S. Appl. No. 14/929,180, filed Oct. 30, 2015, dated Jul. 27, 2018, 9 pgs.

Kumar, Samant; Advisory Action for U.S. Appl. No. 14/929,220, filed Oct. 30, 2015, dated Jul. 27, 2018, 8 pgs.

Kumar, Samant; Non-Final Office Action for U.S. Appl. No. 15/818,803, filed Nov. 21, 2017, dated Jul. 25, 2018, 46 pgs.

Tiwari, Rajeev; Advisory Action for U.S. Appl. No. 15/348,920, filed Nov. 10, 2016, dated Jul. 17, 2018, 8 pgs.

Tiwari, Rajeev; Non-Final Office Action for U.S. Appl. No. 15/348,920, filed Nov. 10, 2016, dated Aug. 24, 2018, 10 pgs.

Tiwari, Rajeev; Advisory Action for U.S. Appl. No. 15/624,967, filed Jun. 16, 2017, dated Jul. 17, 2018, 7 pgs.

Tiwari, Rajeev; Notice of Allowance for U.S. Appl. No. 15/624,967, filed Jun. 16, 2017, dated Aug. 28, 2018, 6 pgs.

Kumar, Samant; Non-Final Office Action for U.S. Appl. No. 15/642,915, filed Jul. 6, 2017, dated Oct. 2, 2018, 15 pgs.

Kumar, Samant; Corrected Notice of Allowance for U.S. Appl. No. 14/866,752, filed Sep. 25, 2015, dated Oct. 4, 2018, 5 pgs.

Kumar, Samant; Issue Notification for U.S. Appl. No. 14/866,752, filed Sep. 25, 2015, dated Oct. 17, 2018, 1 pg.

Kumar, Samant; Notice of Allowance for U.S. Appl. No. 15/813,838, filed Nov. 15, 2017, dated Oct. 2, 2018, 52 pgs.

Kumar, Samant; Corrected Notice of Allowance for U.S. Appl. No. 15/624,961, filed Jun. 16, 2017, dated Sep. 28, 2018, 9 pgs.

Kumar, Samant; Issue Notification for U.S. Appl. No. 15/624,961, filed Jun. 16, 2017, dated Oct. 10, 2018, 1 pg.

Kumar, Samant; Non-Final Office Action for U.S. Appl. No. 14/929,180, filed Oct. 30, 2015, dated Oct. 1, 2018, 15 pgs.

Kumar, Samant; Non-Final Office Action for U.S. Appl. No. 14/929,220, filed Oct. 30, 2015, dated Oct. 1, 2018, 13 pgs.

Kumar, Samant; Final Office Action for U.S. Appl. No. 15/818,803, filed Nov. 21, 2017, dated Nov. 26, 2018, 20 pgs.

Tiwari, Rajeev; Notice of Allowance for U.S. Appl. No. 15/348,920, filed Nov. 10, 2016, dated Dec. 4, 2018, 11 pgs.

Tiwari, Rajeev; Issue Notification for U.S. Appl. No. 15/624,967, filed Jun. 16, 2017, dated Nov. 29, 2018, 1 pg.

Tiwari, Rajeev; Supplemental Notice of Allowance for U.S. Appl. No. 15/624,967, filed Jun. 16, 2017, dated Sep. 19, 2018, 7 pgs.

Kumar, Samant; Final Office Action for U.S. Appl. No. 15/642,915, filed Jul. 6, 2017, dated Apr. 5, 2018, 18 pgs.

Kumar, Samant; Issue Notification for U.S. Appl. No. 14/866,630, filed Sep. 25, 2015, dated Apr. 11, 2018, 1 pg.

Kumar, Samant; Supplemental Notice of Allowance for U.S. Appl. No. 14/866,630, filed Sep. 25, 2015, dated Jan. 31, 2018, 9 pgs.

Kumar, Samant; Supplemental Notice of Allowance for U.S. Appl. No. 14/866,630, filed Sep. 25, 2015, dated Mar. 30, 2018, 6 pgs.

Kumar, Samant; Certificate of Correction for U.S. Appl. No. 14/866,720, filed Sep. 25, 2015, dated Feb. 13, 2018, 1 pg.

Kumar, Samant; Notice of Allowance for U.S. Appl. No. 14/948,143, filed Nov. 20, 2015, dated Jan. 25, 2018, 13 pgs.

Kumar, Samant; Issue Notification for U.S. Appl. No. 14/987,538, filed Jan. 4, 2016, dated Jan. 31, 2018, 1 pg.

Kumar, Samant; Issue Notification for U.S. Appl. No. 15/057,085, filed Feb. 29, 2016, dated Jan. 31, 2018, 1 pg.

Kumar, Samant; Issue Notification for U.S. Appl. No. 14/866,780, filed Sep. 25, 2015, dated Oct. 19, 2016, 1 pg.

Kumar, Samant; Notice of Allowance for U.S. Appl. No. 14/866,780, filed Sep. 25, 2015, dated Jul. 19, 2016, 8 pgs.

Kumar, Samant; Non-Final Office Action for U.S. Appl. No. 14/866,630, filed Sep. 25, 2015, dated Aug. 9, 2017, 24 pgs.

Kumar, Samant; Issue Notification for U.S. Appl. No. 14/866,720, filed Sep. 25, 2015, dated Oct. 18, 2017, 1 pg.

Kumar, Samant; Non-Final Office Action for U.S. Appl. No. 14/866,720, filed Sep. 25, 2015, dated Jan. 23, 2017, 17 pgs.

Kumar, Samant; Notice of Allowance for U.S. Appl. No. 14/866,720, filed Sep. 25, 2015, dated Jun. 29, 2017, 26 pgs.

Kumar, Samant; Notice of Allowance for U.S. Appl. No. 14/866,720, filed Sep. 25, 2015, dated Aug. 28, 2017, 11 pgs.

Kumar, Samant; Response to Rule 312 Communication for U.S. Appl. No. 14/866,720, filed Sep. 25, 2015, dated Jul. 26, 2017, 2 pgs.

Kumar, Samant; Ex-Parte Quayle Office Action for U.S. Appl. No. 14/948,925, filed Nov. 23, 2015, dated Jun. 20, 2017, 29 pgs.

Kumar, Samant; Notice of Allowance for U.S. Appl. No. 14/948,925, filed Nov. 23, 2015, dated Sep. 20, 2017, 15 pgs.

Kumar, Samant; Supplemental Notice of Allowance for U.S. Appl. No. 14/948,925, filed Nov. 23, 2015, dated Oct. 5, 2017, 2 pgs.

Kumar, Samant; Non-Final Office Action for U.S. Appl. No. 14/987,538, filed Jan. 4, 2016, dated Jul. 21, 2017, 18 pgs.

Kumar, Samant; Notice of Allowance for U.S. Appl. No. 14/987,538, filed Jan. 4, 2016, dated Mar. 23, 2017, 12 pgs.

Kumar, Samant; Non-Final Office Action for U.S. Appl. No. 15/624,961, filed Jun. 16, 2017, dated Jan. 19, 2017, 7 pgs.

Kumar, Samant; Non-Final Office Action for U.S. Appl. No. 14/929,180, filed Oct. 30, 2015, dated Aug. 22, 2017, 32 pgs.

Kumar, Samant; Non-Final Office Action for U.S. Appl. No. 14/929,220, filed Oct. 30, 2015, dated Aug. 24, 2017, 31 pgs.

Kumar, Samant; Non-Final Office Action for U.S. Appl. No. 15/057,085, filed Feb. 29, 2016, dated Apr. 7, 2017, 15 pgs.

Kumar, Samant; Notice of Allowance for U.S. Appl. No. 15/057,085, filed Feb. 29, 2016, dated Sep. 29, 2017, 28 pgs.

Kumar, Samant; International Search Report and Written Opinion for PCT/US16/53768, filed Sep. 26, 2016, dated Feb. 3, 2017, 17 pgs.

Kumar, Samant; International Search Report and Written Opinion for PCT/US2016/058507, filed Oct. 24, 2016, dated Jan. 3, 2017, 12 pgs.

Businesswire; Article entitled: "GENBAND and CTDI Settle Legal Dispute", located at <http://www.businesswire.com/news/home/20140321005528/en/GENBAND-CTDI-Settle-Legal-Dispute>, Mar. 21, 2014, 1 pg.

(56) References Cited

OTHER PUBLICATIONS

CED Magazine; Article entitled: "Cable Connects In Atlanta", located at <https://www.cedmagazine.com/article/2006/04/cable-connects-atlanta>, Apr. 30, 2006, 21 pgs.
Consumer Electronics Net; Article entitled: "Teleplan Enhances Test Solution Portfolio with Titan", located at <http://www.consumerelectronicsnet.com/article/Teleplan-Enhances-Test-Solution-Portfolio-With-Titan-4673561>, published on Nov. 1, 2016, 3 pgs.
Digital Producer; Article entitled: "S3 Group Unveils Exclusive Partnership in North America With First US StormTest(TM) Decision Line Customer", located at <http://www.digitalproducer.com/article/S3-Group-Unveils-Exclusive-Partnership-in-North-America-With-First-US-StormTest(TM)-Decision-Line-Customer—1668213>, Sep. 8, 2011, 3 pgs.
Electronic Design; Article entitled: "Testing of MPEG-2 Set-Top Boxes Must be Fast, Thorough", located at http://www.electronicdesign.com/print/839>, published Nov. 18, 2001, 9 pgs.
Euromedia; Article entitled: "Automated TV Client testing: Swisscom partners with S3 Group to deliver the ultimate IPTV experience", located at <http://advanced-television.com/wp-content/uploads/2012/10/s3.pdf>, earliest known pub. date—May 30, 2013, 2 pgs.
Exact Ventures; Report entitled: North American Telecommunications Equipment Repair Market, located at http://www.fortsol.com/wp-content/uploads/2016/08/Exact-Ventures-NA-Repair-Market-Report.pdf>, earliest known publication date Aug. 1, 2016, 12 pgs.
Nordman, Bruce, "Testing Products with Network Connectivity," Jun. 21, 2011 [retrieved online at http://citeseerx.is1.psu.edu/viewdoc/download?doi=10.1.1.695.772&rep=rep1&type=pdf on Feb. 6, 2017], 20 pgs.
Promptlink Communications; Article entitled: "Promptlink Communications Officially Launches Sep-Top Box Testing Platform", located at <https://www.promptlink.com/company/assets/media/2014-05-20.pdf>, published on May 20, 2014, 2 pgs.
Promptlink; Article entitled: "Cable Modem Test Platform", located at <https://www.promptlink.com/products/cmtp.html>, earliest known publication date Aug. 11, 2016, 10 pgs.
Promptlink; Article entitled: "Set-Top Box Test Platform", located at <http://promptlink.com/products/stbtp.html>, earliest known publication date Aug. 11, 2016, 7 pgs.
S3 Group; Document entitled: "White Paper: The Importance of Automated Testing in Set-Top Box Integration", earliest known publication date Jun. 17, 2014, 11 pgs.
Teleplan; Article entitled: "Screening & Testing", located at <https://www.teleplan.com/innovative-services/screening-testing/>, earliest known publication date Mar. 21, 2015, 7 pgs.
Tvtechnology; Article entitled: "S3 Group's StormTest", located at <http://www.tvtechnology.com/expertise/0003/s3-groups-stormtest/256690>, published May 1, 2012, 2 pgs.
Kumar, Samant; Non-Final Office Action for U.S. Appl. No. 15/642,915, filed Jul. 6, 2017, dated Nov. 1, 2017, 42 pgs.
Kumar, Samant; Notice of Allowance for U.S. Appl. No. 14/866,630, filed Sep. 25, 2015, dated Dec. 20, 2017, 19 pgs.
Kumar, Samant; Non-Final Office Action for U.S. Appl. No. 14/866,752, filed Sep. 25, 2015, dated Nov. 7, 2017, 26 pgs.
Kumar, Samant; Issue Notification for U.S. Appl. No. 14/948,925, filed Nov. 23, 2015, dated Nov. 16, 2017, 1 pg.
Kumar, Samant; Non-Final Office Action for U.S. Appl. No. 14/948,143, filed Nov. 20, 2015, dated Dec. 28, 2017, 39 pgs.
Kumar, Samant; Corrected Notice of Allowance for U.S. Appl. No. 14/987,538, filed Jan. 4, 2016, dated Jan. 10, 2018, 8 pgs.
Kumar, Samant; Notice of Allowance for U.S. Appl. No. 14/987,538, filed Jan. 4, 2016, dated Dec. 4, 2017, 20 pgs.
Kumar, Samant; Response to Amendment under Rule 312 for U.S. Appl. No. 14/987,538, filed Jan. 4, 2016, dated Jan. 17, 2018, 2 pgs.
Kumar, Samant; Notice of Non-Compliant Amendment for U.S. Appl. No. 15/624,961, filed Jun. 16, 2017, dated Jan. 10, 2018, 5 pgs.
Kumar, Samant; Corrected Notice of Allowance for U.S. Appl. No. 15/057,085, filed Feb. 29, 2016, dated Oct. 31, 2017, 6 pgs.
Tiwari, Rajeev; Non-Final Office Action for U.S. Appl. No. 15/348,920, filed Nov. 10, 2016, dated Nov. 20, 2017, 53 pgs.
Tiwari, Rajeev; Non-Final Office Action for U.S. Appl. No. 15/624,967, filed Jun. 16, 2017, dated Nov. 7, 2017, 52 pgs.
Kumar, Samant; Notice of Allowance for U.S. Appl. No. 14/866,752, filed Sep. 25, 2015, dated May 17, 2018, 16 pgs.
Kumar, Samant; Issue Notification for U.S. Appl. No. 14/948,143, filed Nov. 20, 2015, dated May 16, 2018, 1 Pg.
Kumar, Samant; Supplemental Notice of Allowance for U.S. Appl. No. 14/948,143, filed Nov. 20, 2015, dated May 7, 2018, 7 pgs.
Kumar, Samant; Notice of Allowance for U.S. Appl. No. 15/624,961, filed Jun. 16, 2017, dated May 22, 2018, 44 pgs.
Kumar, Samant; Final Office Action for U.S. Appl. No. 14/929,180, filed Oct. 30, 2015, dated May 8, 2018, 35 pgs.
Kumar, Samant; Final Office Action for U.S. Appl. No. 14/929,220, filed Oct. 30, 2015, dated May 10, 2018, 38 pgs.
Tiwari, Rajeev; Final Office Action for U.S. Appl. No. 15/348,920, filed Nov. 10, 2016, dated Apr. 30, 2018, 34 pgs.
Tiwari, Rajeev; Final Office Action for U.S. Appl. No. 15/624,967, filed Jun. 16, 2017, dated May 8, 2018, 40 pgs.
Kumar, Samant; International Preliminary Report on Patentability for PCT Application No. PCT/US2016/053768, Sep. 26, 2016, dated Apr. 5, 2018, 13 pgs.
Kumar, Samant; International Preliminary Report on Patentability for PCT Application No. PCT/US2016/058507, filed Oct. 24, 2016, dated May 11, 2018, 12 pgs.
Kumar, Samant; Corrected Notice of Allowance for U.S. Appl. No. 15/642,915, filed Jul. 6, 2017, dated Apr. 10, 2019, 7 pgs.
Kumar, Samant; Issue Notification for U.S. Appl. No. 15/642,915, filed Jul. 6, 2017, dated Apr. 24, 2019, 1 pg.
Kumar, Samant; Supplemental Notice of Allowance for U.S. Appl. No. 15/642,915, filed Jul. 6, 2017, dated Mar. 25, 2019, 8 pgs.
Kumar, Samant; Corrected Notice of Allowance for U.S. Appl. No. 16/103,546, filed Mar. 25, 2019, dated Mar. 25, 2019, 7 pgs.
Kumar, Samant; Corrected Notice of Allowance for U.S. Appl. No. 16/103,546, filed Aug. 14, 2018, dated Apr. 9, 2019, 6 pgs.
Kumar, Samant; Supplemental Notice of Allowance for U.S. Appl. No. 14/929,220, filed Oct. 30, 2015, dated Apr. 12, 2019, 7 pgs.
Kumar, Samant; Supplemental Notice of Allowance for U.S. Appl. No. 14/929,220, filed Oct. 30, 2015, dated May 6, 2019, 7 pgs.
Tiwari, Rajeev; Corrected Notice of Allowance for U.S. Appl. No. 15/348,920, filed Nov. 10, 2016, dated Mar. 27, 2019, 13 pgs.
Tiwari, Rajeev; Issue Notification for U.S. Appl. No. 15/348,920, filed Nov. 10, 2016, dated Apr. 10, 2019, 1 pg.
Kumar, Samant; Non-Final Office Action for U.S. Appl. No. 16/278,534, filed Feb. 18, 2019, dated Jun. 11, 2019, 25 pgs.
Kumar, Samant; Final Office Action for U.S. Appl. No. 16/283,340, filed Feb. 22, 2019, dated Aug. 13, 2019, 19 pgs.
Kumar, Samant; Non-Final Office Action for U.S. Appl. No. 16/283,340, filed Feb. 22, 2019, dated Jun. 12, 2019, 51 pgs.
Kumar, Samant; Notice of Allowance for U.S. Appl. No. 15/642,915, filed Jul. 6, 2017, dated Feb. 28, 2019, 11 pgs.
Kumar, Samant; Notice of Allowance for U.S. Appl. No. 16/103,546, filed Aug. 14, 2018, dated Jan. 28, 2019, 36 pgs.
Kumar, Samant; Corrected Notice of Allowance for U.S. Appl. No. 15/813,838, filed Nov. 15, 2017, dated Feb. 12, 2019, 6 pgs.
Kumar, Samant; Issue Notification for U.S. Appl. No. 15/813,838, filed Nov. 15, 2017, dated Jan. 9, 2019, 1 pg.
Kumar, Samant; Issue Notification for U.S. Appl. No. 15/813,838, filed Nov. 15, 2017, dated Feb. 20, 2019, 1 pg.
Kumar, Samant; Final Office Action for U.S. Appl. No. 15/624,950, filed Jun. 16, 2017, dated Dec. 20, 2018, 33 pgs.
Kumar, Samant; Notice of Allowance for U.S. Appl. No. 14/929,220, filed Oct. 30, 2015, dated Feb. 19, 2019, 24 pgs.
Kumar, Samant; Advisory Action for U.S. Appl. No. 15/818,803, filed Nov. 21, 2017, dated Feb. 5, 2019, 13 pgs.
Tiwari, Rajeev; Corrected Notice of Allowance for U.S. Appl. No. 15/348,920, filed Nov. 10, 2016, dated Feb. 26, 2019, 8 pgs.
Kumar, Samant; Non-Final Office Action for U.S. Appl. No. 16/215,689, filed Dec. 11, 2018, dated Oct. 29, 2019, 53 pgs.
Kumar, Samant; Non-Final Office Action for U.S. Appl. No. 16/400,512, filed May 1, 2019, dated Aug. 22, 2019, 48 pgs.

(56) References Cited

OTHER PUBLICATIONS

Kumar, Samant; Notice of Allowance for U.S. Appl. No. 16/400,512, filed May 1, 2019, dated Nov. 4, 2019, 16 pgs.
Kumar, Samant; Notice of Allowance for U.S. Appl. No. 16/215,689, filed Dec. 11, 2018, dated Nov. 13, 2019, 11 pgs.

* cited by examiner

CORE TESTING MACHINE

CROSS REFERENCE TO RELATED APPLICATIONS

This application is a continuation of U.S. patent application Ser. No. 14/866,720, filed Sep. 25, 2015, now U.S. Pat. No. 9,810,735, and entitled "Core Testing Machine," the disclosure of which is hereby incorporated by reference herein in its entirety. This application is also related to U.S. patent application Ser. No. 14/866,630, filed Sep. 25, 2015, now U.S. Pat. No. 9,960,989, and entitled "Universal Device Testing System," and to U.S. patent application Ser. No. 14/866,752, filed Sep. 25, 2015, now U.S. Pat. No. 10,122,611, and entitled "Universal Device Testing Interface," and to U.S. patent application Ser. No. 14/866,780, filed Sep. 25, 2015, now U.S. Pat. No. 9,491,454 and entitled, "Set Top Boxes Under Test," each of which is hereby incorporated by reference in its entirety. This application is also related to U.S. patent application Ser. No. 14/948,143, filed Nov. 20, 2015 , now U.S. Pat. No. 9,992,084, and entitled, "Cable Modems/eMTAs Under Test," and to U.S. patent application Ser. No. 14/948,925, filed Nov. 23, 2015, now U.S. Pat. No. 9,838,295, and entitled, "Wireless Routers Under Test," and to U.S. patent application Ser. No. 14/929,180, filed Oct. 30, 2015, published on May. 4, 2017 as U.S. Patent Publication No. 2017/0126536, and entitled, "Hardware Architecture for Universal Testing System: Cable Modem Test," and to U.S. patent application Ser. No. 14/929,220, filed Oct. 30, 2015, published on May 4, 2017 as U.S. Patent Publication No. 2017/0126537, and entitled, "Hardware Architecture for Universal Testing System: Wireless Router Test," and to U.S. patent application Ser. No. 14/987,538, filed Jan. 4, 2016, now U.S. Pat. No. 9,900,116, and entitled, "Test Sequences Using Universal Testing System."

TECHNICAL FIELD

The present invention is directed to a system for testing devices.

DETAILED DESCRIPTION

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

According to certain embodiments, a core testing machine comprises multiple slots for installing a DUT in each slot. As a non-limiting example, each DUT in a respective slot is associated with its respective lightweight virtualization containers (probes abstraction) and core testing executor/processor. For example, the core testing machine may comprise N core testing servers and each of the N core testing servers may be associated with M core testing executors/processors. According to certain embodiments, the core testing machine need not have every slot installed with a DUT in order to begin running the tests. The slots are used as needed. Further, the testing of a given DUT can start and finish independently of the other DUTs installed in the test bench of the core testing machine.

Non-limiting examples of devices under test (DUTs) include set top boxes, cable modems, embedded multimedia terminal adapters, and wireless routers including broadband wireless routers for the home or for commercial networks.

Figure 1:
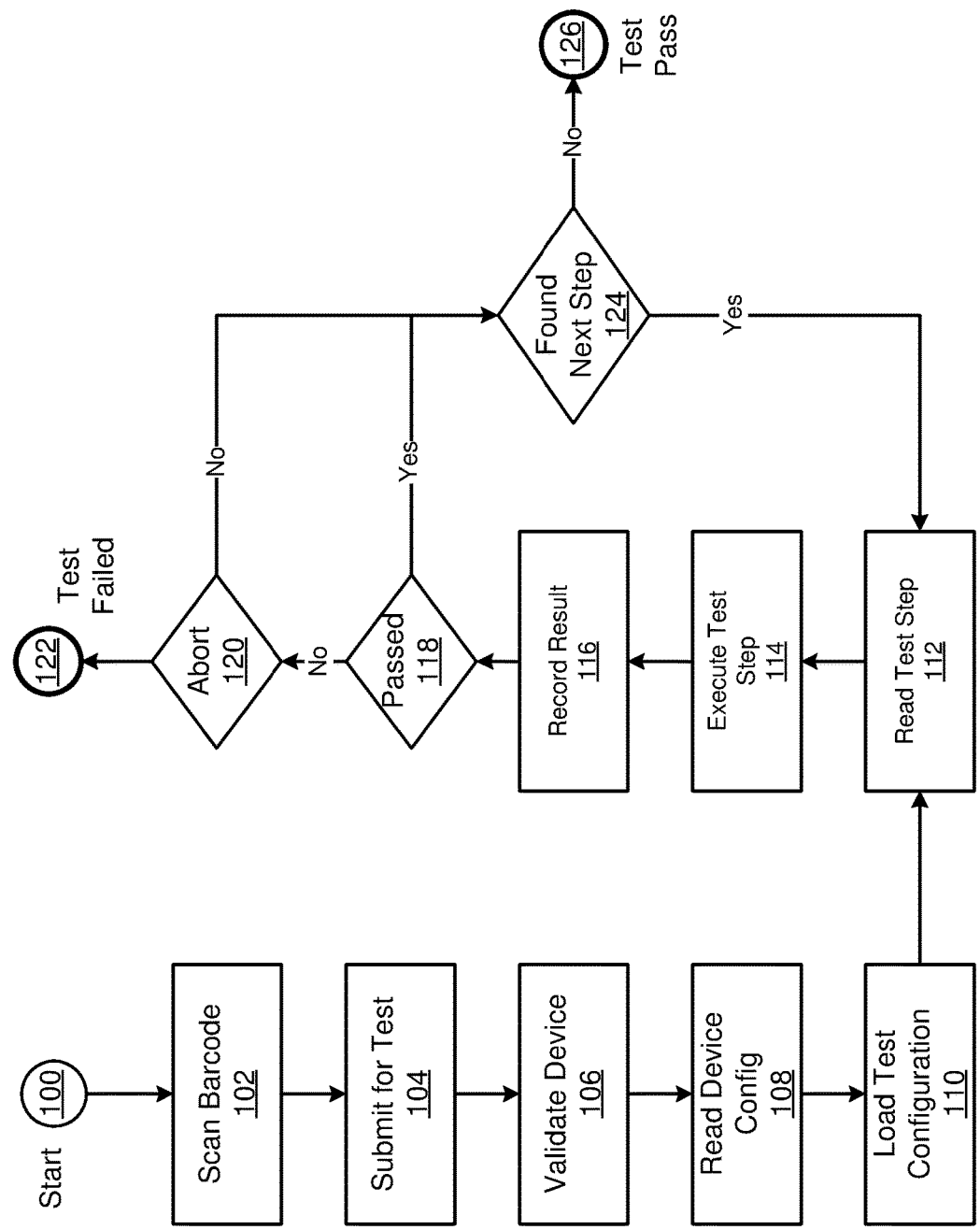
FIG. 1 a high-level flow chart that illustrates some steps performed by a core testing executor/processor for testing devices, according to certain embodiments.

According to certain embodiments, FIG. 1 a high-level flow chart that illustrates some steps performed by a core testing executor/processor for testing devices, according to certain embodiments. According to certain embodiments, the core testing executor/processor is associated with a server. According to certain other embodiments, the core testing executor is special processor. At block 100, a user installs one or more devices to be tested into test bench of the core testing machine for testing the devices. According to certain embodiments, at block 102, the user scans the barcode (or other identification) of each device to be tested. A device that is to be tested using the core testing executor/processor is also referred to as "DUT" herein. Each DUT is then submitted for testing at block 104. For purposes of convenience, FIG. 1 will be described with respect to a single DUT even though the core testing machine is capable of testing multiple DUTs simultaneously. For a given DUT, the respective core testing executor/processor receives a corresponding serial number information and validates the corresponding DUT at block 106. At block 108, the core testing executor/processor retrieves device information such as make, model, customer, etc. of a given DUT based on the serial number information from a database or web service, for example. At block 110, the core testing executor/processor loads the specific test configuration information corresponding to the given DUT. Each DUT type (based on make, model, etc) may be associated with different test configuration information. Each test configuration information includes a set of testing steps. At block 112, the core testing executor/processor begins to read a testing step of the test configuration information for a given DUT. At block 114, the core testing executor/processor executes the test step that was read at block 112. At block 116, the core testing executor/processor records the result of the executed test step. At block 118, the core testing executor/processor determines whether the DUT passed or failed the executed test step. If the DUT failed the executed test step at block 118, then the core testing executor/processor determines whether to abort the testing procedure (based on the test configuration) at block 120. If the core testing executor/processor determines to abort the testing procedure at block 120, then the DUT is deemed to have failed the test step at block 122. If the core testing executor/processor determines not to abort the testing procedure at block 120, or if the DUT passed the executed test step at block 118, then control passes to block 124 where the core testing executor/processor determines whether there is another test step to be executed from the set of testing steps for the given DUT. If it is determined that there is another test step to be executed, then control passes back to block 112. If it is determined that there are no more test steps in the set of test steps to be executed for the given DUT, then the DUT is deemed to have passed the test procedure, according to certain embodiments of the invention. Upon completion of each test step for a given DUT, a message of the completion and/or the results of the test step is sent to the user's browser via web-sockets in real-time, for example. Thus, the user interface can show test progress in addition to testing information such as port numbers, IP address for each DUT slot, DUT serial number, and testing preferences related to billing and pushing to the cloud, etc. The use can also provide input associated with a given test (e.g., password). The user (via user interface) can communicate with the core testing executor/processor using asynchronous feedback and interaction. As a non-limiting example, communication may be in the form of JSON messages using TCP/IP protocol, according to certain embodiments. JSON is Java script object notation for transmitting data between the server and web applications.

According to certain embodiments, the core testing machine can test a set of similar types of devices or disparate types of devices simultaneously using a separate set of interfaces for each device that is under test testing. As a non-limiting example, there may be N core testing servers. Each N core testing server may comprise M number of core testing executors/processors. Thus, a total of N multiplied by M number of DUTS can be tested simultaneously (one DUT is each of the N×M slots, for example). According to certain embodiments, the use of DUT testing interfaces (probes) through virtualization containers can avoid network conflicts while testing multiple DUTs simultaneously by the core testing machine. According to certain embodiments, the core testing servers and core testing executors/processors (and other components) in the testing system may be distributed over a plurality of computers.

Figure 2:
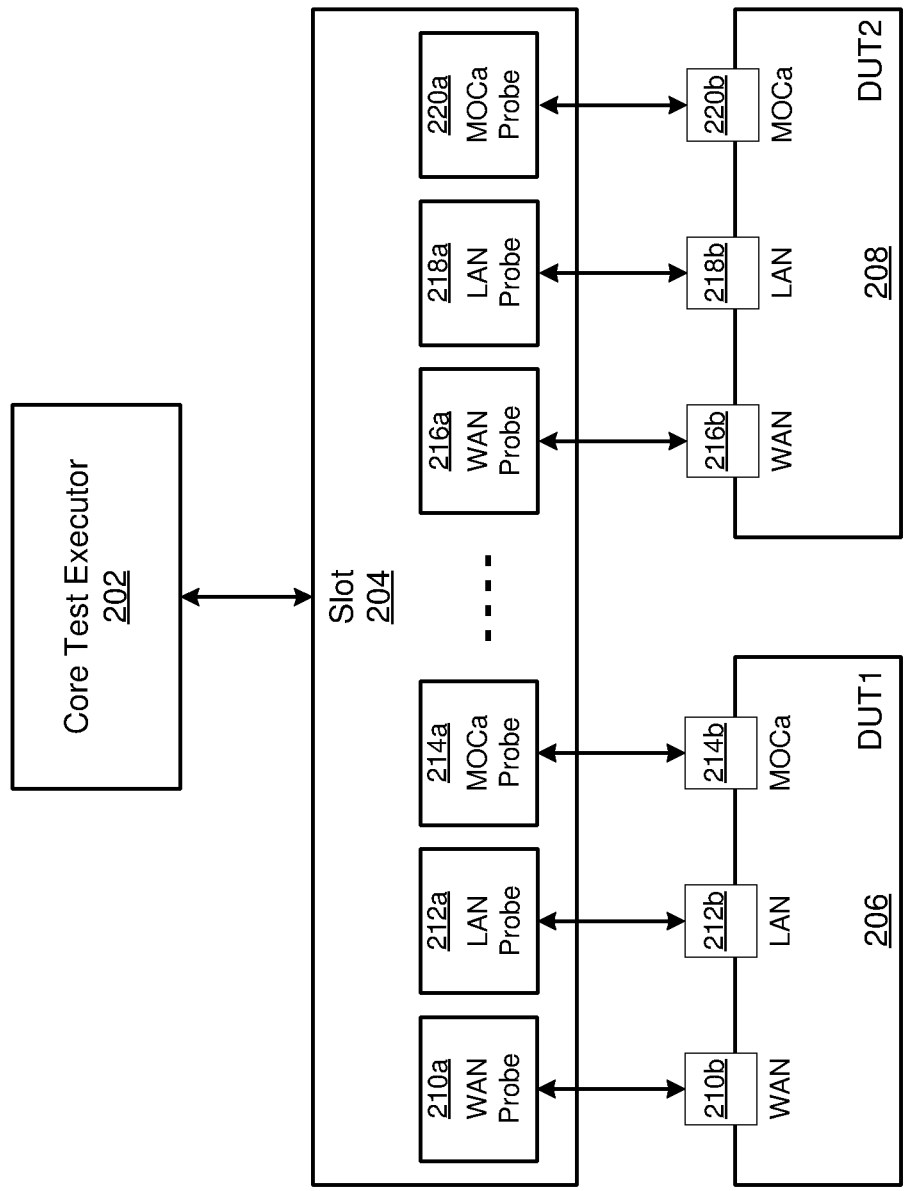
FIG. 2 is a high-level schematic that illustrates DUT probes through the use of virtualization containers, according to certain embodiments.

FIG. 2 is a high-level schematic that illustrates DUT probes through the use of software containers (virtualization containers), according to certain embodiments. FIG. 2 shows core test executor/processor 202, slot 204, and DUTs 206 and 208. There may be more than two DUTs but only two of them are shown in FIG. 2 for convenience. Slot 204 includes as non-limiting examples, Ethernet wide area network (WAN) probes 210a, 216a, Ethernet local area network (LAN) probes 212a, 218a and a multimedia over coax alliance (MoCA) probes 214a, 220a (MoCA probes can be WAN or LAN, for example). Depending on the nature of the DUT and the DUT's corresponding test configuration, there may also be wireless probes via antenna (Wifi probes, for example). Slot 204 are connected to the interfaces of DUT 206 and DUT 208 respectively. For example, WAN probe 210a is connected to WAN port 210b of DUT 206. LAN probe 212a is connected to LAN port 212b of DUT 206. MoCA probe 214a is connected to MoCA port 214b of DUT 206. Similarly, WAN probe 216a is connected to WAN port 216b of DUT 208. LAN probe 218a is connected to LAN port 218b of DUT 208. MoCA probe 220a is connected to MoCA port 220b of DUT 208.

Probes test the following interfaces on the DUT (when such interfaces are available on the DUT):

Ethernet Local Area Network (LAN): assigned probe runs Ethernet-based connection and speed tests Ethernet Wide Area Network (WAN): assigned probe runs Ethernet-based connection and speed tests Multimedia over Coax Alliance (MoCA) LAN: assigned probe sets up MoCA connection, establishes connection, and runs MoCA-related connection and speed tests MoCA WAN: assigned probe sets up MoCA connection, establishes connection, and runs MoCA-related connection and speed tests Wireless 2.4 GHz: assigned probe sets up wireless connection, establishes connection, and runs WiFi-related connection tests on 2.4 GHz frequency Wireless 5.0 GHz: assigned probe sets up wireless connection, establishes connection, and runs WiFi-related connection tests on 5.0 GHz frequency Phone ports (FXS): assigned probe sets up phone service simulation, establishes connection, and runs phone-based connection tests USB: assigned probe runs USB-functionality tests Video: assigned probe runs video-related tests Audio: assigned probe runs audio-related tests According to certain embodiments, when executing a specific test for a given DUT, the core testing executor/processor loads and reads test configuration information (for example from an XML structure) and identifies the relevant test script that needs to be executed. Inputs that are needed for executing the relevant test script are retrieved and supplied as inputs to the relevant test script. The following is a non-limiting sample scripts.

Create DUT object & Environment Object

Verify Serial Number

Verify Warranty

Check Report Server

Check DUT Staging

Checks for DUT Serial number in Database or Webservice

Get DUT Readiness Information

Checks Webservice for test readiness status of DUT in the test process

Configure container Environment

Clear Environment Temp Files

Analyze DUT for Factory Reset

Checks ability to login to DUT

Asks operator to manually Factory Reset if unable to login

Confirm Factory Reset (if needed)

Waits for operator to confirm that DUT was factory reset and booted up properly

Check Ethernet LAN connections to DUT

Ping connections: Eth LAN 1, 2, 3, 4

Fails if any ping to these connections fail

Detect DUT

Checks connection to DUT through socket connection

Reset Password

Operator scans password which is stored temporarily for use in the remainder of test until finished Login to GUI Done through web-scraping Get DUT Information and compare values Information retrieved through web-scraping Enable Telnet Enables telnet on DUT through web-scraping Factory Reset Factory resets DUT through telnet command Enable Telnet after Factory Reset Enables telnet on DUT through web-scraping Confirm Power, WAN Ethernet, and Internet LEDs
Confirm all LAN Ethernet LEDs
Confirm WiFi LED
Configure Wireless Network
   Through telnet commands
   Sets N Mode
   Enables Privacy
   Sets WPA (Wi-Fi Protected Access)
   Removes WEP (Wired Equivalent Privacy)
   Assigns WiFi Channel to DUT (channel different by slot)
   [Channel 1: slots 1, 4, 7, 10, 13, 16]
   [Channel 6: slots 2, 5, 8, 11, 14]
   [Channel 11: slots 3, 6, 9, 12, 15]
   Verifies changes through GUI
   Disables WiFi once done through telnet
Check Firmware Version and Upgrade Firmware (if needed)
   Firmware version: 40.21.18
Cage Closed Confirmation Check
   Asks Operator to Close Door on Cage
Connect Wireless Card
   Waits on shared Resource Server (located on TC) for Resource L2 (Layer 2) Lock
   Lock waiting timeout: 600 sec
   All L2 Locks are able to run in parallel but not when any
     L3 (Layer 3) Lock is running
   Obtains Lock
   Enables WiFi through telnet
   Set WiFi Card
   Total Retries allowed: 6 (2 sets of 3 retries)
   Ping WiFi from DUT
   L2 ARP Test on WiFi: must receive 10/10 ARP packets
   Total Retries allowed: 6 (2 sets of 3 retries)
   If either Set WiFi Card or L2 ARP Test Fail after its 3 retries, Ask Operator to Check Antennas
   Performs one more retry in full (set of 3 retries each for Set WiFi Card and L2 ARP Wifi Test) after Check Antennas
   Disables WiFi through telnet
   Releases Lock
Wireless to LAN Ethernet Speed Test
   Waits on shared Resource Server (located on TC) for Resource L3 Lock
   Lock waiting timeout: 1800 sec
   L3 Locks must be run one at a time and when no L2 Lock
     is running
   Obtains Lock
   Enables WiFi through telnet
   Connects WiFi Card
   Iperf3 Speed Test, 5 seconds for UDP Speed Test, 7 seconds for TCP Speed Test, Sending 200 Mbps Bandwidth
   Bandwidth must be greater than 60 Mbps on TCP (Reverse) or 70 Mbps on UDP (Forward)
   If Fail after 2 retries, ask operator to Check Antennas
   Retries up to 2 times more if still Fail
   Therefore, Total Retries allowed: 4 (2 sets of 2 retries)
   Runs sudo iwlist wlan0 scan and returns all Wireless Signals seen
   Results parsed to print all visible SSIDs and its matching
     Signal level
   Disables WiFi through telnet
   Releases Lock
Confirm WPS LED
Confirm LAN Coax LED
Confirm USB 1+2 LEDs
Configure WAN MoCA
Confirm WAN Coax LED
Ping WAN MoCA
L2 Test on LAN Ethernet
   Arp Test from Eth LAN 1 to Eth LAN 2, 3, 4
   Must receive 10/10 on all LAN connections
LAN Ethernet to LAN Ethernet Speed Test
   From Eth LAN 1 to Eth LAN 2, 3, 4
   Iperf3 Speed Test, 5 seconds Reverse and Forward, Sending 1200 Mbps Bandwidth
   Bandwidth must be greater than 700 Mbps
   Total Retries allowed: 2
Check WAN and LAN MoCA Data Rates
   Rx and Tx Data rates for both WAN and LAN MoCA retrieved through telnet
   All Rates must be greater than 180 Mbps
LAN Ethernet to WAN MoCA FTP Speed Test
   From Eth LAN 1 to WAN MoCA
   Iperf3 Speed Test, 5 seconds Reverse and Forward, Sending 1200 Mbps Bandwidth
   Bandwidth must be greater than 60 Mbps
   Total Retries allowed: 2
LAN MoCA to LAN Ethernet FTP Speed Test
   From Eth LAN 1 to LAN MoCA
   Iperf3 Speed Test, 5 seconds Reverse and Forward, Sending 240 Mbps Bandwidth
   Bandwidth must be greater than 60 Mbps
   Total Retries allowed: 2
LAN MoCA to WAN MoCA FTP Speed Test
   From LAN MoCA to WAN MoCA
   Iperf3 Speed Test, 5 seconds Reverse and Forward, Sending 240 Mbps Bandwidth
   Bandwidth must be greater than 60 Mbps
   Total Retries allowed: 2
Enable WAN Ethernet
   Through telnet command
LAN Ethernet to WAN Ethernet FTP Speed Test
   From Eth LAN 1 to Eth WAN
   Iperf3 Speed Test, 5 seconds Reverse and Forward, Sending 1200 Mbps Bandwidth
   Bandwidth must be greater than 700 Mbps
   Total Retries allowed: 2
Clear Persistent Logs
Final Factory Restore According to certain embodiments, the core testing executor/processor uses a reflection and command design pattern to invoke the relevant configured script(s) corresponding to each DUT being tested. For example, in the command design pattern one or more of the following are encapsulated in an object: an object, method name, arguments. According to certain embodiments, the core testing executor/processor uses the Python "reflection" capability to execute the relevant test scripts for a given DUT. The core testing executor/processor is agnostic of the inner workings of the relevant test scripts for a given DUT.

According to certain embodiments, lightweight software containers are used to abstract the connection of probes to the different DUT interfaces in order to avoid conflicts. Non-limiting examples of virtualization containers are Linux containers. As a non-limiting example, Linux container is an operating-system-level virtualization environment for running multiple isolated Linux systems (containers) on a single Linux control host. In other words, lightweight software containers are used to ensure isolation across servers. By using containers, resources can be isolated, services restricted, and processes provisioned to have an almost completely private view of the operating system with their own process ID space, file system structure, and network interfaces. Multiple containers share the same kernel, but each container can be constrained to only use a defined amount of resources such as CPU, memory, network resources and I/O. The relevant test script might need to connect to the DUT interfaces directly or through the virtualization containers to execute the tests. The core testing executor/processor receives the test results from running the relevant test scripts. The core testing executor/processor can further process and interpret such results and can also send the results to the user's browser via web sockets. According to certain embodiments, the respective core testing executors/processors are in communication (e.g., Telnet/SSH) with the virtualization containers (there may be multiple virtualization containers). The containers/probes are in communication with corresponding DUT interfaces using Telnet/SSH/TCP/UDP/HTTP/HTTPS etc, as non-limiting examples.

According to certain embodiments, a system for testing device comprises: a testing machine with a plurality of slots, wherein each slot of the plurality of slots is for installing a device-under-test (DUT) of a plurality of DUTs; a plurality of core testing processors, wherein each core testing processor of the plurality of core testing processors is associated with a respective slot of the plurality of slots; a plurality of lightweight virtualization containers, where a respective lightweight virtualization container of the plurality of lightweight virtualization containers is associated with one of the slots that might have DUT installed, wherein the plurality of lightweight virtualization containers enable isolation of respective testing processes and testing resources associated with each respective device-under-test.

According to certain embodiments, the plurality of lightweight virtualization containers comprise testing probes for testing a respective DUT of the plurality of DUTs. Virtualization containers can also be referred to as probes herein.

According to certain embodiments, the plurality of lightweight virtualization containers are used for testing one or more DUT interfaces at the DUT comprising: Ethernet Local Area Network (LAN) interface; Ethernet Wide Area Network (WAN) interface; Multimedia over Coax Alliance (MoCA) LAN interface; Multimedia over Coax Alliance (MoCA) WAN interface; Wireless 2.4 GHz interface; Wireless 5.0 GHz interface; Phone ports (FXS) interface; USB interface; video interface; and audio interface According to certain embodiments, each core testing processor of at least a subset of the plurality of core testing processors is associated with a respective web socket for communication that is isolated and independent of communication associated with other core testing processors of the plurality of core testing processors.

According to certain embodiments, a respective core testing processor of the plurality of core testing processors communicates with a user interface.

According to certain embodiments, a respective core testing processor of the plurality of core testing processors communicates using asynchronous feedback and interaction.

According to certain embodiments, a respective core testing processor of the plurality of core testing processors communicates using JSON messages.

According to certain embodiments, the respective core testing processor of the plurality of core testing processors communicates using TCP/IP protocol.

According to certain embodiments, the respective core testing processor of the plurality of core testing processors: retrieves at run time a respective test configuration corresponding to the DUT installed in the respective slot associated with respective core testing processor; loads the set of tests associated with the DUT installed in the respective slot associated with respective core testing processor; and executes the loaded set of tests.

In the foregoing specification, embodiments of the invention have been described with reference to numerous specific details that may vary from implementation to implementation. The specification and drawings are, accordingly, to be regarded in an illustrative rather than a restrictive sense.

We claim:

1. A core testing processor configured to
   receive serial number information for a plurality of devices under test (DUTs);
   retrieve, from a source selected from a database and a web service, type information comprising a make or model of each DUT, retrieval of the type information based upon the serial number information;
   load test configuration information specific to each type of DUT;
   read a test step of the test configuration information loaded for each DUT;
   execute the test step read for each DUT;
   determine whether each DUT passed or failed the executed test step;
   responsive to a determination that a DUT passed the executed test step, determine whether, for each DUT that passed the executed test step, the loaded test configuration information contains a next test step to be executed;
   responsive to a determination that the loaded test configuration contains a next test step to be executed, perform repeated tasks for each DUT for which a next test step exists, the repeated tasks comprising reading the test step, executing the test step read for each DUT, determining whether each DUT passed the executed test step, and determining whether, for each DUT that passed the executed test step, the loaded test configuration information contains a next step to be executed; and
   responsive to a determination that the loaded test configuration does not contain a next test step to be executed, terminate the repeating step for each DUT for which a next test step does not exist.

2. The core testing processor of claim 1, further configured to
   responsive to a determination that a DUT failed the executed test step, determine whether to abort testing for each DUT that failed the executed test step; and
   responsive to a determination to not abort testing, perform the repeated tasks until reaching the determination that the loaded test configuration does not contain a next test step to be executed.

3. The core testing processor of claim 2, further configured to, responsive to a determination to abort testing, indicate testing failure for each DUT for which a determination to abort testing has been made.

4. The core testing processor of claim 2, further configured to communicate, upon completion of each test step, results of the completed test step to a user.

5. The core testing processor of claim 4, wherein communicating the results of the completed test step to the user comprises sending a message to a browser of the user via web-sockets.

6. A system for testing devices, comprising:
   the core testing processor of claim 1; and
   a slot configured to receive a device-under-test (DUT), the slot communicating with the core testing processor and with a lightweight virtualization container configured for association with an interface of a DUT receivable in the slot, the lightweight virtualization container enabling isolation of testing processes and testing resources associated with the DUT receivable in the slot.

7. The system for testing devises of claim 6, where in the core testing processor is configured to communicate with a user interface and with the slot, wherein the core testing processor is associated with communication that is independent of other communications transmitted within the system.

8. The system for testing devices of claim 7, wherein the core testing processor is associated with a web socket for communication that is independent of other communications transmitted within the system.

\* \* \* \* \*